United States Patent
Choi et al.

(10) Patent No.: US 7,476,302 B2
(45) Date of Patent: Jan. 13, 2009

(54) APPARATUS AND METHOD TO DEPOSIT MAGNESIUM OXIDE FILM ON A LARGE AREA

(75) Inventors: Young Wook Choi, Changwon-si (KR); Jee Hyun Kim, Gwangmyeong-si (KR)

(73) Assignee: Korea Electrotechnology Research Institute, Changwon-si (KR)

( * ) Notice: Subject to any disclaimer, the term of this patent is extended or adjusted under 35 U.S.C. 154(b) by 534 days.

(21) Appl. No.: 10/811,946

(22) Filed: Mar. 30, 2004

(65) Prior Publication Data

US 2005/0006225 A1    Jan. 13, 2005

(30) Foreign Application Priority Data

Jul. 8, 2003    (KR) .................... 10-2003-0046154

(51) Int. Cl.
*C23C 14/00* (2006.01)
*C23C 14/32* (2006.01)

(52) U.S. Cl. .................... 204/192.33; 204/192.22; 204/192.15; 204/192.13; 204/298.01; 204/298.03; 204/298.32

(58) Field of Classification Search .............. 204/192.2, 204/192.15, 192.12
See application file for complete search history.

(56) References Cited

U.S. PATENT DOCUMENTS

| | | | | |
|---|---|---|---|---|
| 5,015,493 A | * | 5/1991 | Gruen | 427/571 |
| 5,622,608 A | * | 4/1997 | Lanford et al. | 204/192.15 |
| 5,660,700 A | * | 8/1997 | Shimizu et al. | 204/298.08 |
| 5,900,391 A | * | 5/1999 | Sakakibara et al. | 505/475 |
| 6,245,394 B1 | | 6/2001 | Sakemi et al. | |
| 6,337,001 B1 | * | 1/2002 | Haag et al. | 204/192.2 |
| 6,379,783 B1 | | 4/2002 | Kim et al. | |
| 6,623,607 B1 | | 9/2003 | Stollenwerk et al. | |
| 6,676,814 B1 | | 1/2004 | Stollenwerk et al. | |
| 2001/0050220 A1 | * | 12/2001 | Chiang et al. | 204/192.12 |
| 2005/0029088 A1 | * | 2/2005 | Delahoy et al. | 204/192.12 |

FOREIGN PATENT DOCUMENTS

KR    1020010025739    4/2001
KR    1020020088127    11/2002

\* cited by examiner

*Primary Examiner*—Alexa D. Neckel
*Assistant Examiner*—Michael Band
(74) *Attorney, Agent, or Firm*—Stanzione & Kim, LLP

(57) ABSTRACT

An apparatus and method to deposit a MgO film on a large substrate area. The method includes applying a voltage to one or more magnesium targets; applying an electric current to the one or more magnesium targets when the voltage stops increasing so that a power with a negative square wave, which does not cause mutual interfere, is applied to the one or more magnesium targets; and forming a MgO film on a substrate using magnesium particles emitted from the one or more magnesium targets by the power applied. The disclosed apparatus to deposit a MgO film on a large substrate area includes a magnetron part having at least one magnesium target and a permanent magnet; a power control part to apply power to the at least one magnesium target and separately provide control for each of the at least one magnesium target; a flow control part to supply gases for the at least one magnesium target; a substrate control part to control a substrate; a vacuum control part to control a vacuum state in a chamber; and a heater control part to maintain temperature in the chamber.

15 Claims, 5 Drawing Sheets

APPARATUS AND METHOD TO DEPOSIT MAGNESIUM OXIDE FILM ON A LARGE AREA

CROSS-REFERENCE TO RELATED APPLICATIONS

This application claims the benefit of Korean Application No. 10-2003-46154 filed with the Korea Industrial Property Office on Jul. 8, 2003, the disclosure of which is incorporated herein by reference.

BACKGROUND OF THE INVENTION

1. Field of the Invention

The present invention relates to an apparatus and method for depositing a magnesium oxide film on a substrate, and more particularly, in order to increase the deposition speed of a magnesium oxide (MgO) film using magnetron sputtering discharge developing a new power supply system and its utilizing process to form a MgO film on a plasma display panel (PDP) of 40 to 100 inch in size.

2. Description of the Related Art

In the field of PDP technology, MgO is commonly used as a protective film or an electron release medium. The MgO film is formed by means of physical deposition such as sputtering, thermal deposition, and electron beam evaporation, or metal-organic chemical vapor deposition (MOCVD) by chemical reaction between gaseous reactants. The Korean Patent Publication No. 2002-0088127, Lee and Park, discloses a method of forming a film through MOCVD. MOCVD allows very rapid film formation but has problems such as a comparatively complicated process and a rather high incidence of defective quality.

With deposition using a sputtering method, the deposition process is relatively simple and impurity content in the formed film is very low compared to the MOCVD although the film growth speed is slow. Therefore, if the film growth speed can be increased, the deposition by sputtering may provide a MgO film with good quality and higher productivity.

The Korean Patent Publication No. 2001-0025739, Choi et al., discloses an apparatus and method for depositing MgO film using magnetron-sputtering discharge. The power supply used in the above-mentioned patent publication provides high-frequency waves oscillating from plus polarity to minus polarity. The used frequency is normally between 10 kHz and 13.56 MHz. However, the power supply has a limitation on the increase of MgO film growth speed because ions colliding with magnesium targets cannot obtain enough energy due to wave characteristics of oscillating from plus polarity to minus polarity and self-bias by electrons on the surface of the magnesium targets.

In addition, when a plurality of magnesium targets are arranged in parallel and power is applied to the magnesium targets to generate discharge, the generated discharge may disappear during the operation because power oscillation from plus polarity to minus polarity causes interference between magnesium targets. Therefore, an auxiliary equipment is required to prevent the disappearance of the discharge.

SUMMARY OF THE INVENTION

Accordingly, the present invention is directed to an apparatus and method for depositing a MgO film on a large substrate area that can substantially obviate one or more problems due to limitations and disadvantages of the related art.

An object of the present invention is to provide an apparatus for depositing more rapidly a MgO film on a large area using a power supply for the generation of magnetron-sputtering discharge.

Another object of the present invention is to provide a method for depositing a MgO film on a large substrate area more rapidly, by more than 50%, than a conventional sputtering method.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the present invention provides a method of depositing a MgO film on a large area, comprising the steps of: applying a voltage to at least a magnesium target; applying an electric current to the magnesium targets when the voltage stops increasing so that a power with a negative square wave, which does not cause mutual interfere, is applied to the magnesium targets; and forming a MgO film on a substrate using magnesium particles emitted from the magnesium target by the power applied.

In another aspect, the present invention provide an apparatus for depositing a MgO film on a large substrate area comprising:
- a magnetron part comprising at least a magnesium target and a permanent magnet positioned on one side of the magnesium target;
- a power control part to apply power to the magnesium targets using a voltage and an electric current with a negative square wave which does not interfere mutually, the power control part to separately provide control for each of the magnesium targets;
- a flow control part for supplying gases for the magnesium target;
- a substrate control part for controlling a substrate on which magnesium oxides are deposited;
- a vacuum control part for controlling a vacuum state in a chamber; and
- a heater control part for maintaining temperature in the chamber.

The present invention uses a vertical sputtering apparatus and can be applied to a process for depositing a MgO protection film on the PDP of 40 to 100 inch in size. In addition, the present invention may use all types of substrates made of an insulator as well as a PDP. The power control apparatus used in this invention can adjust voltage, electric current, frequency, and duty ratio according to experimental conditions such as sputtering operation pressure to apply the maximum power to the magnesium target.

This invention employs the way of increasing the number of magnesium targets, arranged in parallel in order to enhance MgO film growth speed. In conventional MgO deposition methods, when a high frequency power is applied to magnesium targets arranged in parallel, interference between magnesium targets occurs during generation of discharge. However, the power control method according to the present invention can obviate the interference between magnesium targets and, therefore, ensure a stable operation for magnesium targets in a parallel position.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
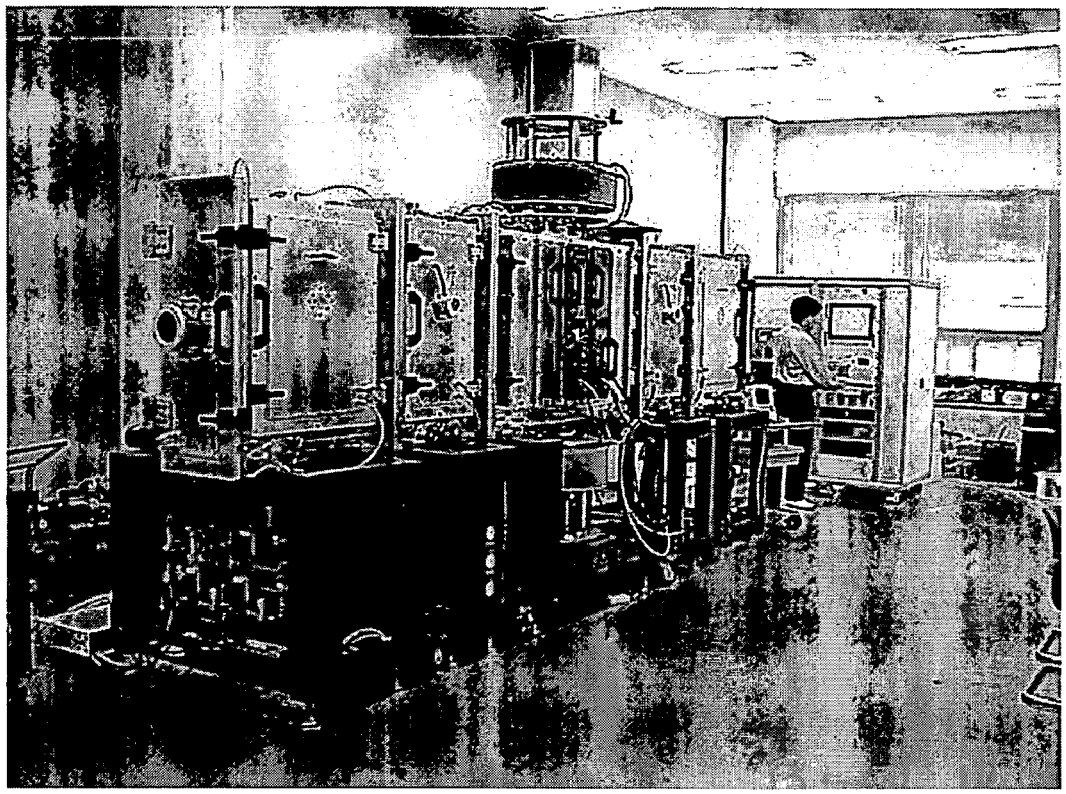
FIG. 1 illustrates a perspective view of an apparatus according to an embodiment of the present invention.

FIG. 1 shows an example of an apparatus for depositing a MgO film on a PDP. In FIG. 1, the apparatus is for a 42-inch panel which measures 5000 mm×1000 mm×2500 mm (width×length×height).

Figure 2:
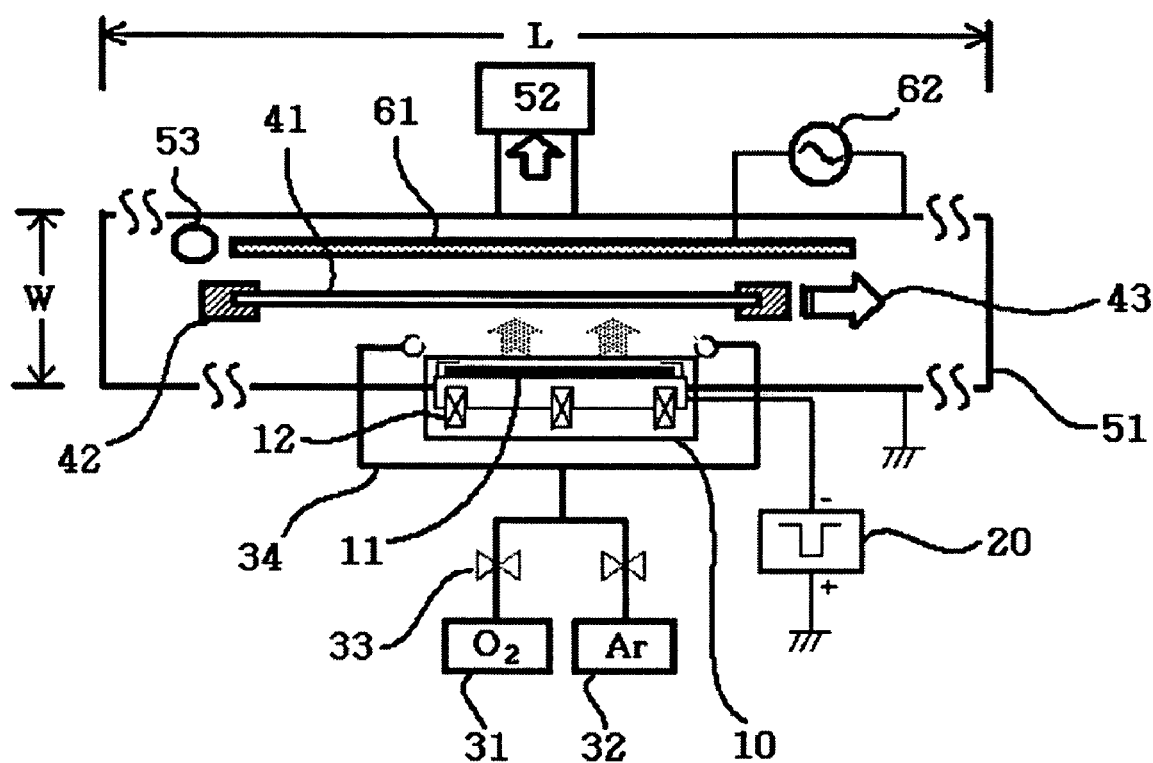
FIG. 2 illustrates a cross-sectional view of an apparatus according to an embodiment of the present invention.

FIG. 2 shows a cross-sectional view of the apparatus in FIG. 1. As shown in FIG. 2, the apparatus for depositing a MgO film with large area comprises a magnetron part, a power control part, a flow control part, a substrate control part, a vacuum control part, and a heater control part. The magnetron part 10 comprises at least a magnesium target 11 and a permanent magnet 12 which is positioned on one side of the magnesium target 11. This invention may install a plurality of magnesium targets in parallel to ensure an appropriate film growth rate.

Figure 3:
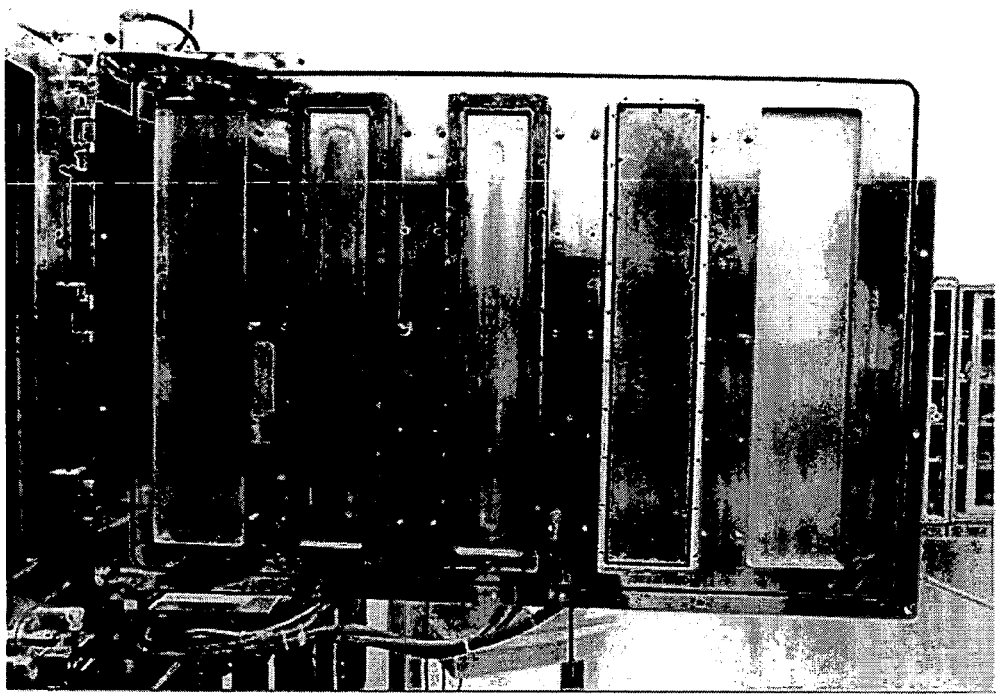
FIG. 3 illustrates an example of magnesium target arrangement according to the present invention.

FIG. 3 shows an example of a magnesium target arrangement in which three magnesium targets are installed on the door of a vacuum chamber. In this embodiment, five magnesium targets may be installed in the vacuum chamber.

The power control part 20 controls separately each of the magnesium targets 11 and applies voltage and electric current with negative square wave, which does not mutually interfere, to the magnesium targets 11. In detail, the power control part 20 separately controls the voltage and electric current and provides negative square wave between 10 kHz and 150 kHz in frequency. The duty ratio for 0 V and the value of voltage applied can be adjusted between 10% and 90% within one cycle. Output voltage is variable to maximum 500V and output current can be adjusted from 1 A to 50 A based on the size of the magnesium target 11.

The flow control part regulates the amount of gases supplied to the magnesium target 11. In the embodiment of the present invention, argon and oxygen are supplied to the magnesium target 11. The ratio of argon to oxygen supplied can be adjusted between 30% and 50% per one magnesium target 11.

The flow control part may comprise an oxygen flow regulator 31, an argon flow regulator 32, cut-off valves 33 to block off gas flow to the magnesium target 11, and a gas supply line 34 to supply the magnesium target 11 with the gases.

The substrate control part controls the movement of a substrate 41 on which magnesium particles emitted from the magnesium target 11 are deposited. The substrate 41 is opposite to the magnesium target 11 and, in the sputtering process during which magnesium particles are emitted from the magnesium target 11, it moves from left to right so that a MgO film can be deposited uniformly thereon. In FIG. 2, the reference numeral 43 indicates the movement direction of the substrate 41. The substrate 41 may be any type of insulator as well as a plasma display panel. The moving substrate 41 is supported by means of a substrate-supporting member 42. The substrate control part is connected with the substrate-supporting member 42 and adjusts appropriately the movement speed of the substrate 41 according to film growth speed.

Figure 4:
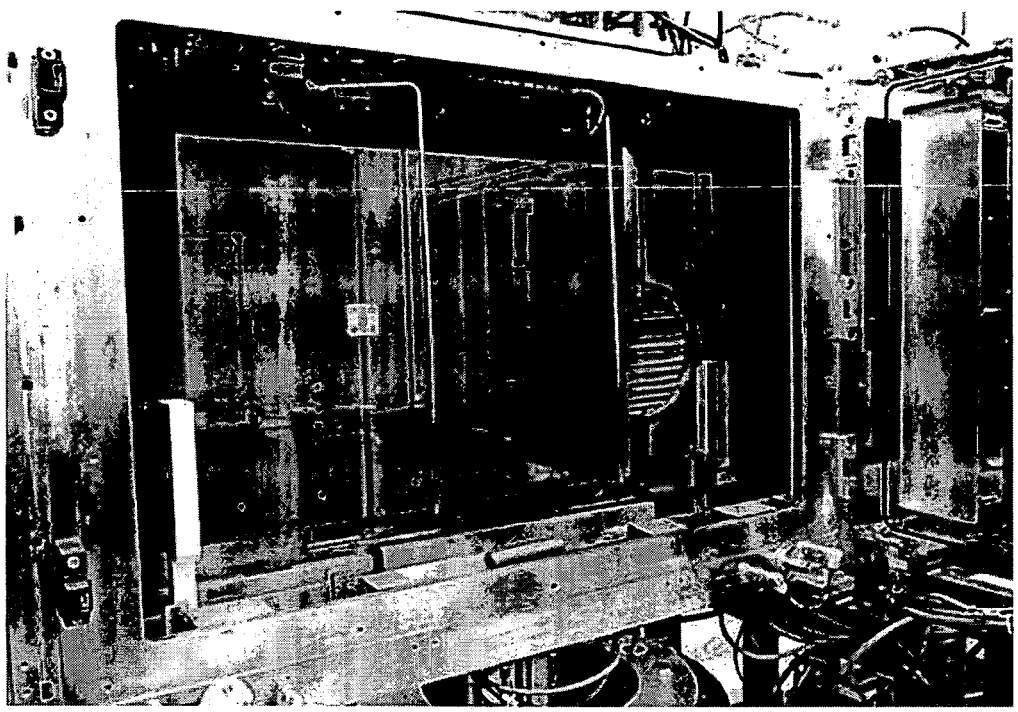
FIG. 4 illustrates a view of a vertical substrate according to an embodiment of the present invention.

FIG. 4 is a view of the inside of the vacuum chamber 51. In the vacuum chamber 51, the substrate 41 on which a MgO film is deposited is installed vertically.

The vacuum control part controls the vacuum state of the vacuum chamber 51. The MgO film is deposited on the substrate 41 in the vacuum chamber 51 and the vacuum state in the vacuum chamber 51 is maintained by a vacuum pump 52 and a vacuum gage 53. In addition, when the power supply applies a voltage and an electric current to the magnesium target 11, oxygen and argon are supplied to the magnesium target 11 while pressure in the vacuum chamber 51 is adjusted between 5 mTorr and 10 mTorr by a pressure regulator. The vacuum chamber 51 is preferably made of aluminum or stainless steel. The vacuum gage 53 may be any type of vacuum gage capable of measuring a vacuum state as well as a Baratron gage.

The heater control part maintains temperature in the vacuum chamber 51 uniformly and controls heating for the substrate 41. In detail, a heater 61 is positioned in a predetermined location with a spacing preferably between 5 cm and 10 cm from the backside of the moving PDP and the temperature in the vacuum chamber 51 is maintained between 100° C. and 200° C. The heater control part has a separate heater power supply 62 independent of the power control part 20 in order to operate the heater 61. The heater 61 may be a heater by radiation heating such as a halogen lamp heater, as well as a heater by resistance heating.

A method of depositing a MgO film on a large substrate area is now described.

The spacing between the PDP and the magnesium target 11 is adjusted preferably between 4 cm and 7 cm. When a voltage is applied to the magnesium target 11, a reactive sputtering process begins and magnesium particles emitted from the magnesium target 11 combine with oxygen. The resulting magnesium oxide is then deposited on the surface of the PDP. The sputtering discharge is generated in the vacuum chamber and in this state the voltage in the magnesium target 11 does not increase anymore although the power supply applies higher voltages. At this time, the voltage at the magnesium target 11 is between 250V and 300 V. Thereafter, a current application controller of the power supply is operated to apply a higher current to the magnesium target 11 until the power applied to the magnesium target 11 is saturated. The saturation point of the power applied is when intermittent sparks occur on the surface of the magnesium target 11 and then an oscilloscope shows a deformed waveform of current. If a higher current is applied, the voltage at the magnesium target 11 again increases and, finally, maximum voltage and current are applied to the magnesium target 11. As a result, a maximum power is applied to the magnesium target 11, maximizing the MgO film growth speed proportional to the power applied. When the power supply applies the maximum power to the magnesium target 11, the frequency used is between 10 kHz and 100 kHz and the duty ratio is between 30% and 60%.

Figure 5:
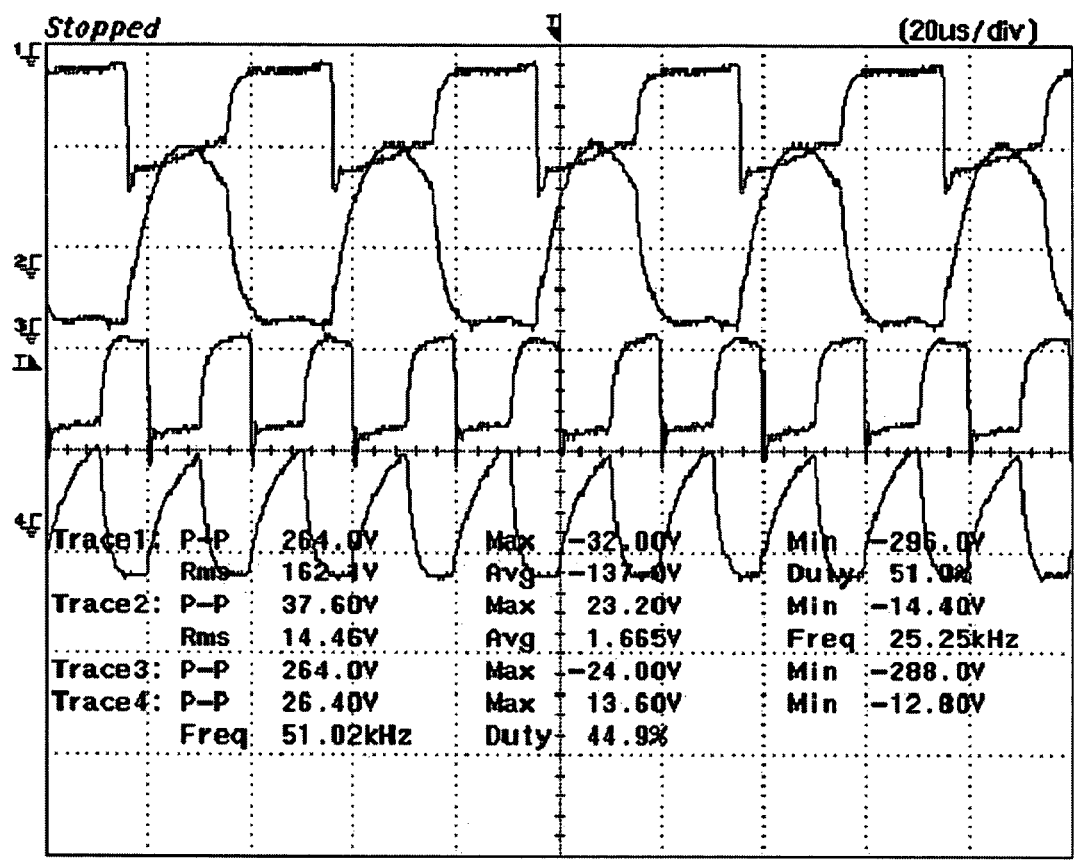
FIG. 5 is a graph showing waveforms generated by a power control method according to the present invention.

FIG. 5 shows examples of voltage and current waveforms when two magnesium targets 11 are connected to two power supplies respectively. Here, the power supplies 1 and 2, operate respectively at 25 kHz and 50 kHz in frequency under conditions of 200 V/div, 20 A/div, and 20 μs/div. From the top, the first and the second waveforms are respectively voltage and current waveforms in the power supply 1, and the third and the fourth waveforms are respectively voltage and current waveforms in the power supply 2. As shown in FIG. 5, there is no interference between the waveforms. The MgO film growth speed measured in this invention is 45 nm/min which is faster than 30 nm/min in a conventional deposition method.

The present invention may install a plurality of magnesium targets in parallel and provide separate power control for each magnesium target to stably operate the magnesium targets arranged in parallel without interference between magnesium targets during the generation of discharge. Accordingly, this invention needs not auxiliary apparatuses such as an arc annihilation apparatus to obviate the interference between magnesium targets. In addition, this invention can enhance the MgO film growth speed by about 50% compared to a conventional art and is applicable to vertical continuous film deposition systems for PDPs of 40 to 100 inch in size.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of depositing a MgO film on a large area including a power control part to apply a voltage and an electric current to at least one magnesium target, the method comprising:

applying a voltage to the magnesium target by the power control part to generate a sputtering discharge thereon;

increasing an electric current applied to the magnesium target by the power control part to increase power on the magnesium target when the voltage on the magnesium target stops increasing in response to an increase in the applied voltage; and forming a MgO film on a substrate using magnesium particles emitted from the magnesium target.

2. The method of claim 1, wherein the voltage applied to the at least one magnesium target is between 250 V and 300 V when the voltage stops increasing.

3. The method of claim 1, wherein the current applied to the at least one magnesium target increases until the power applied to the at least one magnesium target is saturated.

4. The method of claim 3, wherein the saturated power has a frequency between 10 kHz and 100 kHz.

5. The method of claim 4, wherein the duty ratio of the saturated power is between 30% and 60%.

6. An apparatus to deposit a MgO film within a large area comprising:

a magnetron part comprising at least one magnesium target and a permanent magnet positioned on one side of the magnesium target;

a power control part to apply a voltage and an electric current to the magnesium target, the power control part applying the voltage to the at least one magnesium target to generate a sputtering discharge thereon, and subsequently, to increase the current applied to the at least one magnesium target when the voltage on the magnesium target stops increasing when the applied voltage increases;

a flow control part to supply gases to the magnesium target;

a substrate control part to control a substrate on which magnesium oxides are deposited;

a vacuum control part to control a vacuum state in a chamber in which the MgO film is deposited on the substrate; and a heater control part to maintain a temperature in the chamber.

7. The apparatus of claim 6, wherein the power control part operates under conditions between 10 kHz and 150 kHz in frequency, between 10% and 90% in duty ratio, less than 500 V in output voltage, and between 1 A and 50 A in output current.

8. The apparatus of claim 6, wherein the gases supplied to the magnesium target include oxygen and argon.

9. The apparatus of claim 6, wherein the flow control part comprises an oxygen flow regulator, an argon flow regulator, cut-off valves to block off gas flow to the magnesium target, and a gas supply line to supply the magnesium target with the gases.

10. The apparatus of claim 6, wherein the substrate control part supports the substrate using a substrate-supporting member and adjusts movement speed of the substrate.

11. The apparatus of claim 6, wherein the vacuum control part comprises a vacuum pump, a vacuum gage and a pressure regulator.

12. The apparatus of claim 6, wherein the heater control part maintains temperature in the vacuum chamber between 100° C. and 200° C. and is distanced from the substrate by a spacing between 5 cm and 10 cm.

13. The apparatus of claim 6, wherein the heater control part comprises a separate power supply independent of the power control part.

14. The method of claim 1, wherein the electric current is a negative square wave.

15. The method of claim 6, wherein the electric current is a negative square wave.

* * * * *